(12) United States Patent
Ibelings

(10) Patent No.: US 6,348,837 B1
(45) Date of Patent: Feb. 19, 2002

(54) BI-DIRECTIONAL AMPLIFIER HAVING A SINGLE GAIN BLOCK FOR AMPLIFYING BOTH FORWARD AND REVERSE SIGNALS

(75) Inventor: Pieter Ibelings, Norcross, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/634,119

(22) Filed: Aug. 8, 2000

(51) Int. Cl.[7] .............................. H03F 3/68; H01P 5/12
(52) U.S. Cl. .................... 330/126; 330/59; 333/109
(58) Field of Search .................. 330/59, 126; 333/109; 348/693, 707

(56) References Cited

U.S. PATENT DOCUMENTS

| | | | | |
|---|---|---|---|---|
| 4,812,779 A | * | 3/1989 | Wagner | 330/149 |
| 5,774,458 A | * | 6/1998 | Williamson | 370/276 |
| 5,870,395 A | * | 2/1999 | Baran | 370/395 |
| 5,881,362 A | * | 3/1999 | Eldering et al. | 348/7 |
| 6,023,612 A | * | 2/2000 | Harris et al. | 455/127 |
| 6,091,301 A | * | 7/2000 | Vogt | 330/278 |
| 6,215,358 B1 | * | 4/2001 | Hon et al. | 330/289 |

* cited by examiner

Primary Examiner—Robert Pascal
Assistant Examiner—Khanh Van Nguyen
(74) Attorney, Agent, or Firm—Hubert J. Barnhardt, III; Kenneth M. Massaroni; Shelley L. Couturier

(57) ABSTRACT

An amplifier (600) includes a first terminal (605) for receiving forward signals in a first frequency band and a second terminal (655) for receiving reverse signals in a second frequency band. A single gain block (630) is coupled between the first terminal (605) and the second terminal (655) for amplifying the forward signals and the reverse signals. The forward signals, after amplification, are provided to the second terminal (655) for transmission from the amplifier (600), and the reverse signals, after amplification, are provided to the first terminal (605) for transmission from the amplifier (600). In this manner, both forward and reverse signals, which are transmitted in separate frequency bands, can be amplified by a single gain block (630).

15 Claims, 6 Drawing Sheets

BI-DIRECTIONAL AMPLIFIER HAVING A SINGLE GAIN BLOCK FOR AMPLIFYING BOTH FORWARD AND REVERSE SIGNALS

FIELD OF THE INVENTION

This invention relates generally to amplifiers, and more specifically to amplifiers for amplifying bi-directional signals.

BACKGROUND OF THE INVENTION

A communication system 100, such as a two-way cable television system, is depicted in FIG. 1. The communication system 100 includes headend equipment 105 for generating forward signals that are transmitted in the forward, or downstream, direction along a communication medium, such as a fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system split off portions of the forward signals for provision to subscriber equipment 135, such as set top terminals, computers, and televisions. In a two-way system, the subscriber equipment 135 can also generate reverse signals that are transmitted upstream, amplified by any distribution amplifiers 125, converted to optical signals, and provided to the headend equipment 105.

In a two-way system, an amplifier 125 typically incorporates diplex filters and gain blocks when the amplifier both receives and transmits signals, i.e., when the amplifier processes both forward, downstream signals and reverse, upstream signals. Diplex filters are three-port passive devices, each incorporating a high-pass filter and a low-pass filter for filtering the signals. Amplifiers 125 also include gain blocks for amplifying the signals, as illustrated in FIG. 2. The diplex filter 202 of the amplifier 125 has an input/output terminal 205 for processing bi-directional signals. More specifically, the input/output terminal 205 receives an input signal in the forward, or downstream, direction, and the input/output terminal 205 transmits an output signal in the reverse, or upstream, direction. The diplex filter 202 also includes an output port 210 for providing the forward signal in the downstream direction and an input port 215 for receiving the reverse signal from the upstream direction. The high-pass filter 220 and low-pass filter 225 of the diplex filter 202 provide isolation between the bi-directional signals.

Continuing to refer to FIG. 2, the output port 210 of the downstream diplex filter 202 transmits a filtered forward signal to a forward gain block 230 that amplifies the signal. The forward signal is then filtered through another diplex filter 238, which includes a high-pass filter 240 for transmitting the amplified forward signal to an input/output terminal 245 of the amplifier 125 and of the diplex filter 238. The input port 215 of the diplex filter 202 receives an amplified signal from a reverse gain block 235. The reverse signal has been filtered through a low-pass filter 250 of the diplex filter 238. This reverse signal is transmitted upstream, within the reverse path of the amplifier 125, from the input/output terminal 245 of the amplifier 125. Traditionally, amplifiers utilize a distinct gain block, as shown, for the forward path and a separate gain block for reverse path to preserve isolation between forward and reverse signals.

Conventionally, the reverse path signal is routed through the low-pass filters 225, 250 in the two diplex filters 202, 238 due to the frequency of the reverse path being in the low-band frequency spectrum that is typically 5 MHz to 40 MHz. The forward path is routed through the high-pass filters 220, 240 in the two diplex filters 202, 238 due to the frequency of the forward path being in the forward frequency spectrum that is typically 52 MHz to 870 MHz.

It will be appreciated, however, that there are variations of the frequency bandwidth values in the low-band and forward-band depending upon the preferences of the cable television system. The conventional amplifier 125 does have the ability to process different forward and reverse splits by utilizing a plug-in diplex filter. The signals are then routed through the respective gain block for amplification of the forward or reverse signal. More specifically, an operator may, for example, choose to use the reverse bandwidth of 5 MHz to 65 MHz and the forward bandwidth of 88 MHz to 750 MHz. Generally, however, the bandwidth splits are rarely changed once decided due to the potential impact on the channel programming in the lower end of the forward bandwidth. For example, if a television program channel is established at a low-end frequency in the forward bandwidth and the reverse bandwidth is increased, thereby changing the bandwidth split, the program channel quality at the low-end will be negatively impacted or eliminated.

There is, however, an increased demand for reverse services, which requires a corresponding increase in reverse bandwidth. As a result of the increased requirements and in light of the difficulties of increasing the conventional reverse bandwidth, cable television systems may, in the future, begin utilizing a higher-band frequency spectrum for the reverse path, in addition to the low-band frequency spectrum. This higher frequency spectrum may, for instance, be in the 900 MHz to 1200 MHz range. If this is done, reverse bandwidth may be increased without impacting the lower frequency channels in the forward bandwidth.

It will be appreciated, however, that installing new amplifiers with an additional gain block to accommodate this higher-band frequency for the reverse path could substantially increase the cost, the complexity, and the size of the amplifiers. Thus, what is needed is an improved amplifier that can better process forward and reverse signals in any bandwidth split in the downstream and upstream paths.

DETAILED DESCRIPTION OF A PREFERRED EMBODIMENT

As briefly mentioned in the Background of the Invention, two-way communication systems often include optical nodes to transmit optical signals to amplifiers. The amplifiers are then used to boost signal levels as signals are transmitted to remote subscribers. In a two-way communication system, such as a cable television system, the amplifiers, and the amplifiers included in the optical nodes, typically include diplex filters and gain blocks. When a conventional amplifier is used for both receiving and transmitting signals, the conventional circuitry is limited to processing forward and reverse signals with distinct and separate gain blocks.

Figure 1:
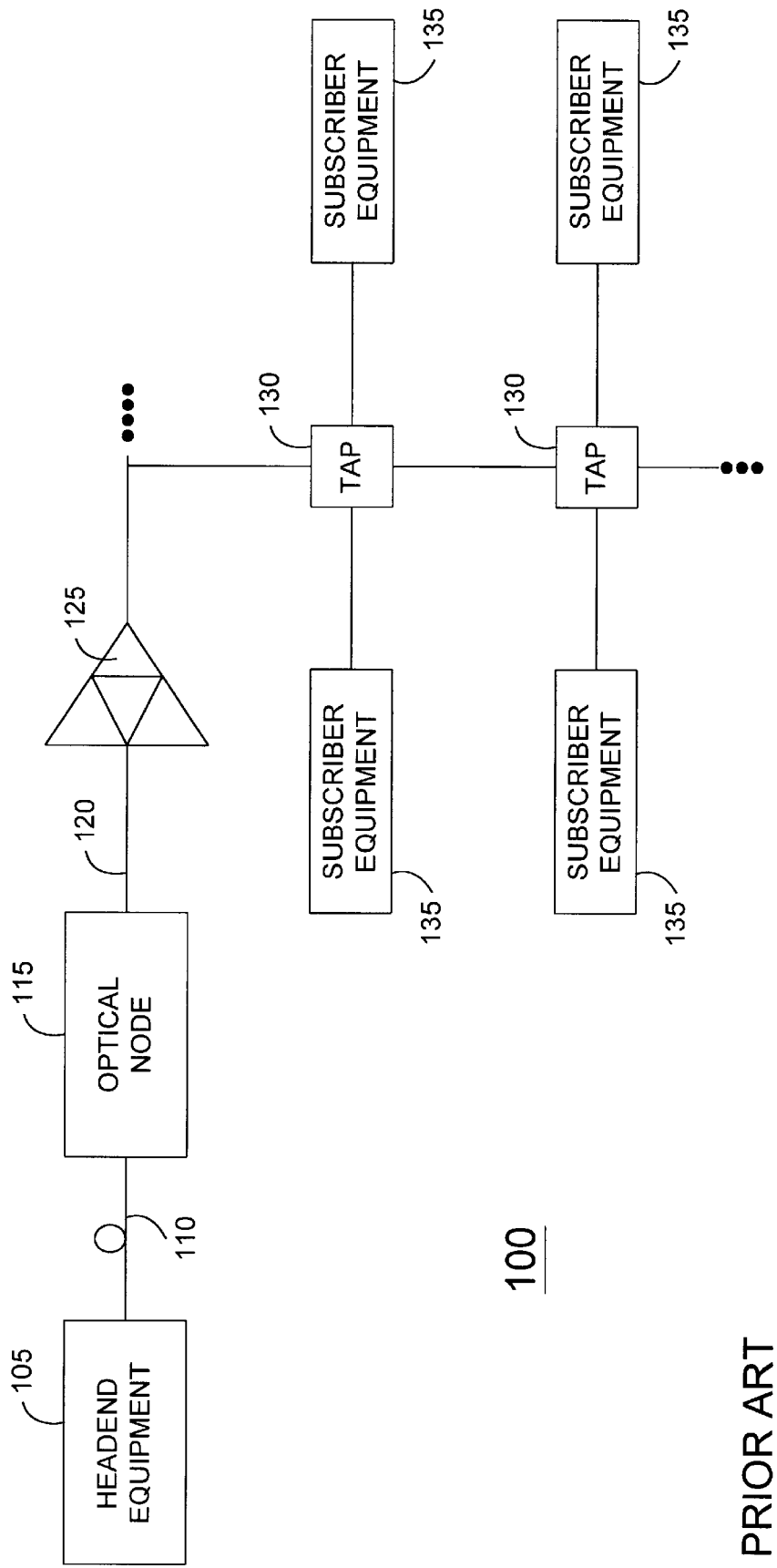
FIG. 1 is a block diagram of a conventional communication system, such as a cable television system.
Figure 2:
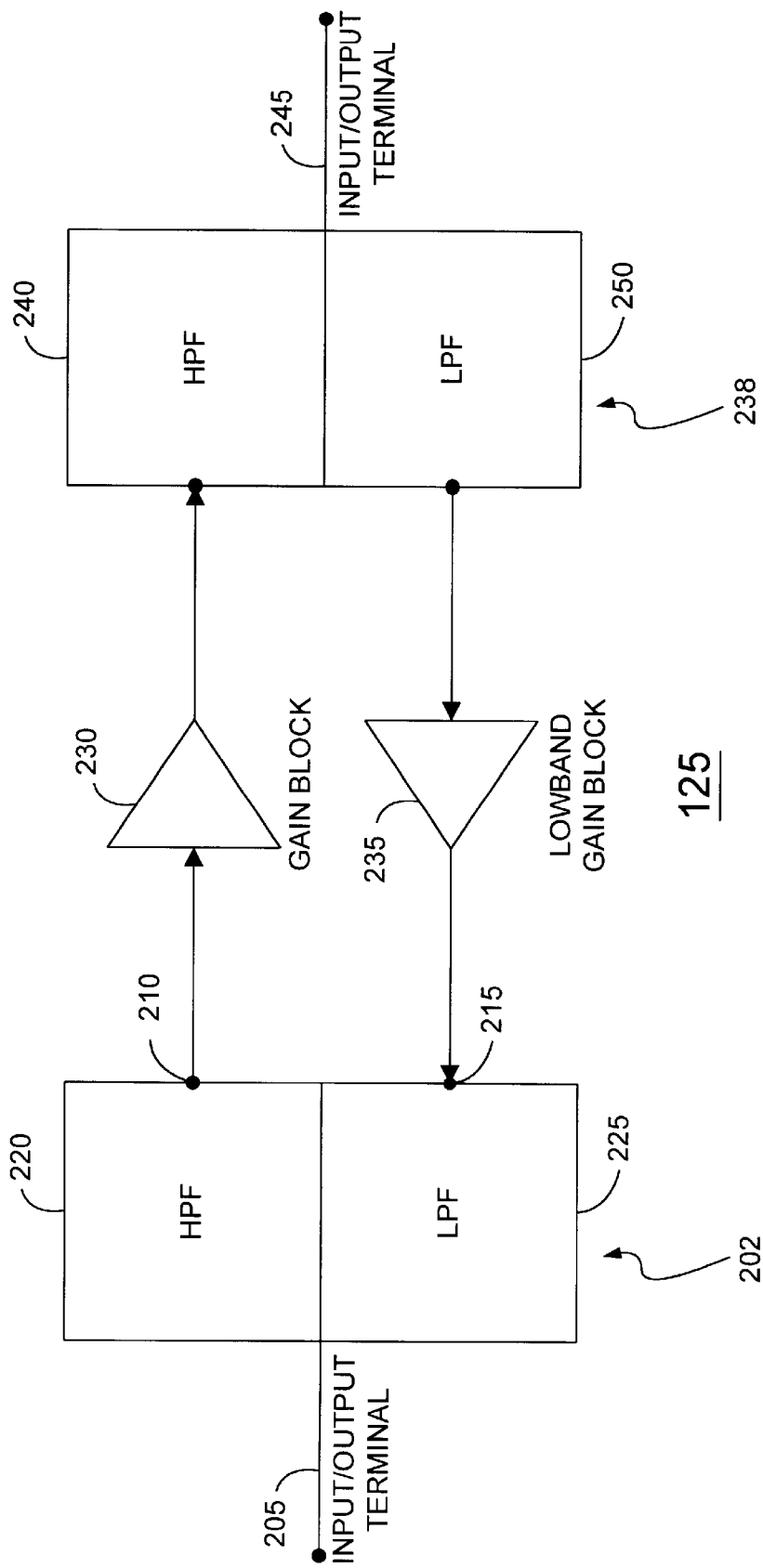
FIG. 2 is a block diagram of the conventional diplex filters and gain block circuitry included in the amplifier of FIG. 1.
Figure 3:
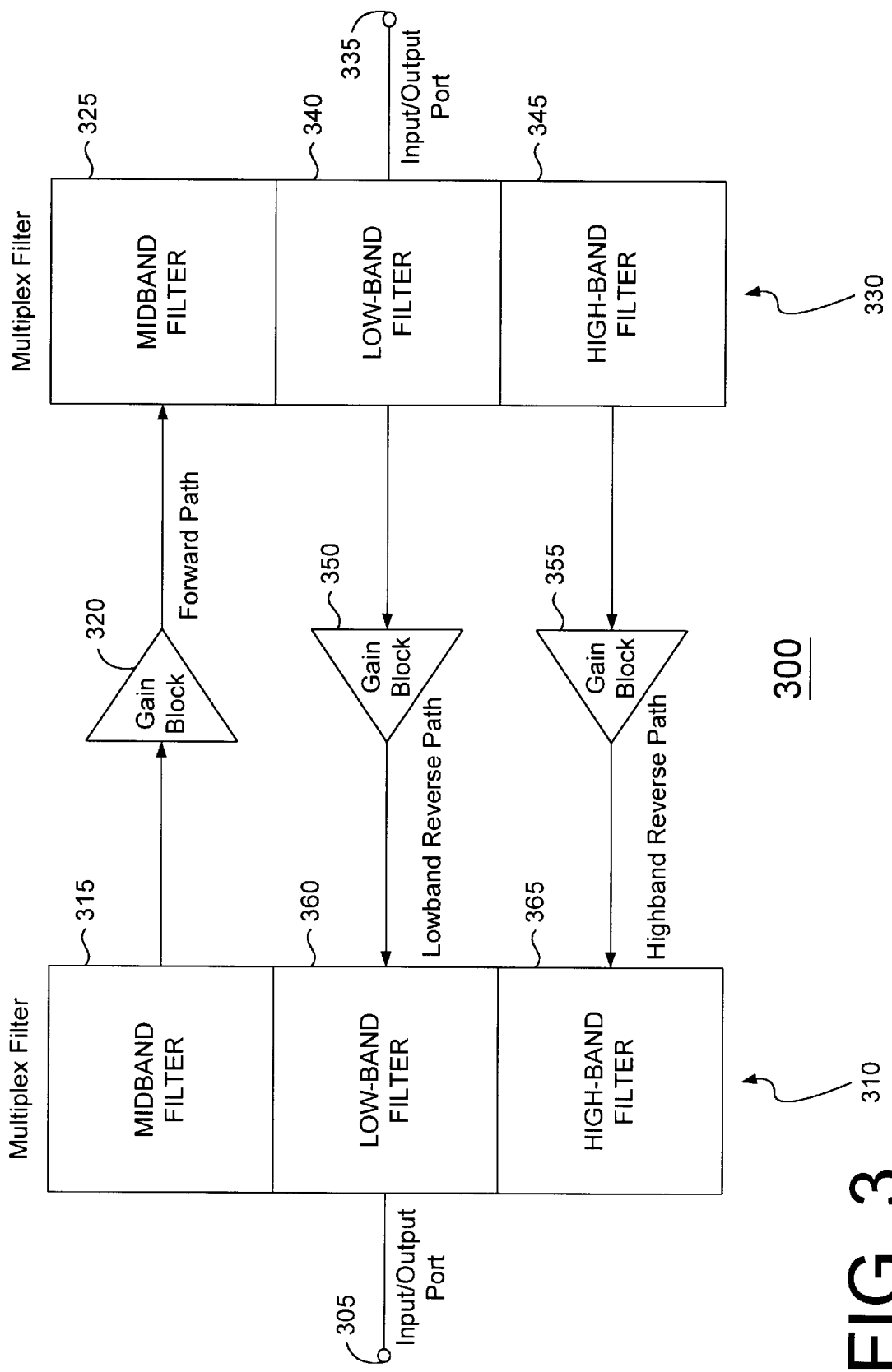
FIG. 3 is a block diagram of an amplifier with diplex filters routing forward and reverse signals to separate and distinct gain blocks.

The two-way communication systems are experiencing an increase in reverse services that require additional reverse bandwidth. One proposed solution to accommodate the additional reverse bandwidth is depicted in FIG. 3, which illustrates an amplifier 300 for processing forward signals within a first frequency band, such as 54 MHz to 870 MHz. The proposed amplifier 300 also processes reverse signals within the separate frequency bands, such as 0 to 42 MHz and 900 MHz to 1200 MHz. As shown, the amplifier 300 has an input/output port 305 for receiving an input signal in the forward, or downstream, direction, and for transmitting an output signal in the reverse, or upstream, direction. A multiplex filter 310, which isolates the bi-directional signals, includes a mid-band frequency filter 315 that filters the forward signal and transmits it to a discrete forward gain block 320. The amplified forward signal is filtered through a mid-band filter 325 in an output multiplex filter 330 to be routed to an input/output terminal 335 for further transmission in the downstream path.

Referring to FIG. 3 in the upstream direction, the input/output terminal 335 accepts a reverse signal and filters it via a low-band frequency filter 340 or a high-band frequency filter 345, depending upon what the frequency bandwidth is for the particular reverse signal that is being processed. The lower frequency reverse signals are passed by the low-band frequency filter 340 to a low-band gain block 350, and the higher frequency reverse signals are passed by the high-band frequency filter 345 to the high-band gain block 355. The input multiplex filter 310 receives the amplified reverse signals, which are filtered through a low-band filter 360 and a high-band filter 365 and then routed upstream through the input/output terminal 305.

This proposed solution is viable; however, it still builds off the prior art amplifier 300 in the use of distinct and separate gain blocks for amplification of the forward and reverse signals. It will be appreciated that this solution, depicted in FIG. 3, is cost prohibitive due to the amplifier 300 having an added gain block, increased circuitry, and space increases on the motherboard of the amplifier 300.

Figure 4:
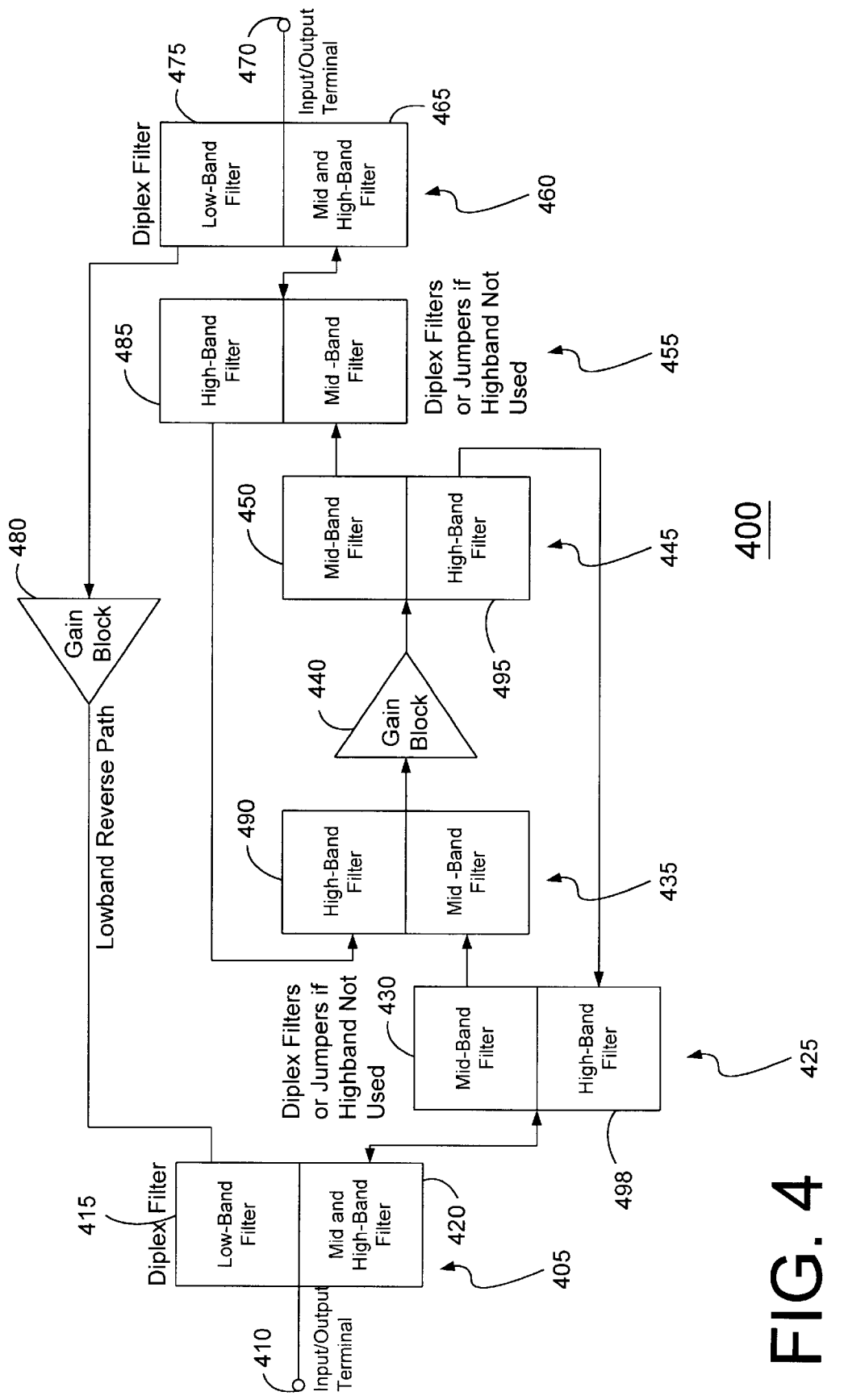
FIG. 4 is a block diagram of an amplifier with diplex filters routing forward and high-band reverse signals on a common path to a single gain block in accordance with the present invention.

In light of the proposed solution depicted in FIG. 3, there is an opportunity to provide an alternative and cost effective amplifier circuit to accommodate the increasing demands on the reverse bandwidth. An advantage of the present invention is that the amplifier circuit of the present invention, which is depicted in FIG. 4, allows a cable operator to include a high-band reverse bandwidth, e.g., a third discrete bandwidth, for additional reverse signals without adding any additional gain blocks. This allows an overall increase in reverse bandwidth while also maintaining lower implementation costs by utilizing one gain block as opposed to two distinct gain blocks and supportive circuitry for processing signals within two separate frequency bandwidths. As will be discussed in further detail below, an optical node encompassing an amplifier can also process the same high-band reverse bandwidth for additional reverse signals that share a common path with the forward signal, all of which can be amplified using a single gain block.

The amplifier 400, as depicted in FIG. 4, with circuitry in accordance with the present invention, includes an input diplex filter 405. The diplex filter 405 includes an input/output port 410 used for receiving an input signal in the forward direction and for transmitting an output signal in the reverse direction. Also included are a low-band filter 415 and a mid/high-band filter 420 that isolate the bi-directional signals. It will be appreciated that the mid/high-band filter 420 can pass both forward, mid-band signals in the downstream direction and reverse, high-band signals in the upstream direction so long as the pass band of the filter 465 is properly configured. A second diplex filter 425 further filters the input signal by way of a mid-band filter 430, and the forward signal is then routed to a third diplex filter 435 to further isolate the forward signal from the reverse path. A single gain block 440 amplifies the forward signal for further transmission to a first output diplex filter 445 with a mid-band filter 450 that filters and routes the signal to a next diplex filter 455 for further isolation. The forward signal proceeds to a final diplex filter 460 with a mid/high-band filter 465 and is then routed to the input/output terminal 470 of the amplifier 400, from which point the amplified forward signal continues downstream to the next device in the transmission system.

Referring to FIG. 4 in the upstream direction, the input/output terminal 470 accepts a reverse signal and filters the reverse signal by way of a low-band filter 475 or the mid/high-band filter 465 depending upon the frequencies of the reverse path signals. If the reverse signal is in the conventional low-band reverse frequency spectrum, the low-band filter 475 transmits the signal through a separate low-band gain block 480 for amplification and routes the signal through the final diplex filter 405, where it continues upstream through the input/output terminal 410.

If the reverse signal is in the high-band reverse frequency spectrum, the mid/high-band filter 465 allows the reverse signal to pass. The reverse signal is then isolated from the forward signal through a high-band filter 485 in the diplex filter 455. The reverse signal is further isolated in the diplex filter 435, which includes a high-band filter 490. The filtered high-band reverse signal is then routed onto the same common path as the forward signal and to the input of the single gain block 440. A high-band filter 495 then isolates the high-band reverse signal from the forward signal, and the reverse signal is routed to a high-band filter 498, which further isolates the signal from the forward path. The high-band reverse signal then continues upstream through the final mid/high-band filter 420 by way of the input/output terminal 410.

The single gain block 440 amplifies both the forward signal and the high-band reverse signal, and both of these signals share a common input path and a common output path with respect to the gain block 440. The overall gain frequency range should be no less than the total frequency of the forward signal and the high-band reverse signal in which the gain block 440 is to amplify. For example, the gain block 440 should be no less than 52 MHz to 1200 MHz to accommodate both a forward signal from 52 MHz to 870 MHz and a high-band reverse signal from 900 MHz to 1200 MHz.

In this depiction of the present invention, it will be appreciated that the amplifier 400 incorporates additional diplex filters, when compared to prior art amplifiers, to accommodate this increase in reverse bandwidth. It is known that diplex filters are much less expensive, in both technological development and implementation, than an additional gain block and the necessary supportive circuitry.

The amplifier of the present invention, therefore, provides an easier and cost effective manner in which to increase the reverse bandwidth than the earlier proposed solution.

The diplex filters used in the amplifier 400 of the present invention are configured to process frequencies within the chosen forward and reverse frequency bands. When, for example, reverse signals are sent in the 0–40 MHz frequency spectrum and the 900–1200 MHz frequency spectrum and forward signals are sent in the 52–870 MHz frequency spectrum, the low-band filters should pass signals having frequencies from aboug 0–40, the mid-band filters should pass signals having frequencies from about 52–870 MHz, the high-band band filters should pass signals having frequencies greater than about 900 MHz, and the mid/high-band filters should pass signals having frequencies greater than about 50 MHz.

Figure 5:
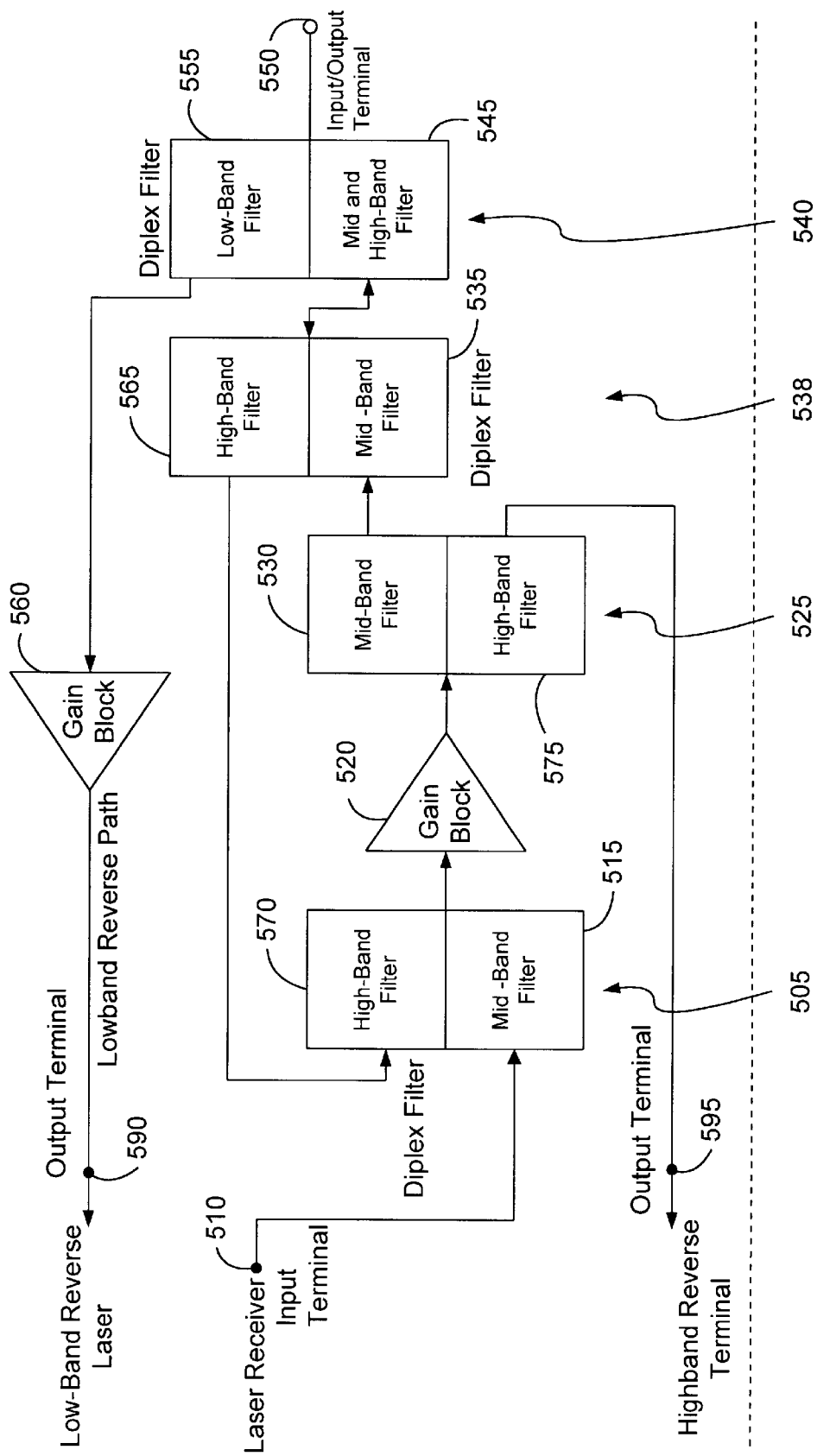
FIG. 5 is a block diagram of an optical node with diplex filters routing forward and high-band reverse signals on a common path to a single gain block in accordance with the present invention.

Similarly, the same invention can be applied to an optical node, which encompasses an amplifier as depicted in FIG. 5. The optical node 500 with the circuitry in accordance with the present invention includes a diplex filter 505 that receives a forward signal from the laser receiver into the input port 510. A mid-band filter 515 transmits the forward signal to a single gain block 520 for amplification. Unlike the amplifier 400 in FIG. 4 that requires two diplex filters in series for isolation of the forward and reverse signals, the optical node 500 requires only one for filtering. The amplified forward signal is then filtered through a diplex filter 525 with a mid-band filter 530. Further isolation is performed by another mid-band filter 535 in a diplex filter 538. A final diplex filter 540 with a mid/high-band filter 545 routes the forward signal to the input/output terminal 550 for further transmission to the next device in the communication system.

Referring to FIG. 5 in the upstream direction, the input/output terminal 550 accepts a reverse signal, which is filtered by way of a low-band filter 555 or the mid/high-band filter 545. If the reverse signal has a frequency in the conventional low-band reverse frequency spectrum (or range), the low-band filter 555 transmits the signal through a separate low-band gain block 560 for amplification, and the reverse signal is then routed to the low-band reverse laser.

If the reverse signal has a frequency in the high-band reverse frequency spectrum, the mid/high-band filter 545 allows the reverse signal to pass to a high-band filter 565 in the diplex filter 538, where the reverse signal is isolated from the forward signal. A second high-band filter 570 in the diplex filter 505 accepts the reverse signal, which is further isolated from the forward path. The filtered high-band reverse signal is then routed onto the same common path as the forward signal and amplified by the single gain block 520. The output of the single gain block 520 is filtered through a high-band filter 575 for filtering the reverse signal from the forward signal and then continues upstream to the high-band reverse laser. It will also be noted that, as illustrated in FIG. 5, two output terminals 590, 595, one for the low-band reverse signals and one for the high-band reverse signals, can be reduced to one output terminal. For example, if a downconverter is present in the amplifier, the high-band reverse signal frequency can be downconverted to a lower frequency and mixed with the low-band reverse signal frequency so that it can be processed through a common reverse laser.

Figure 6:
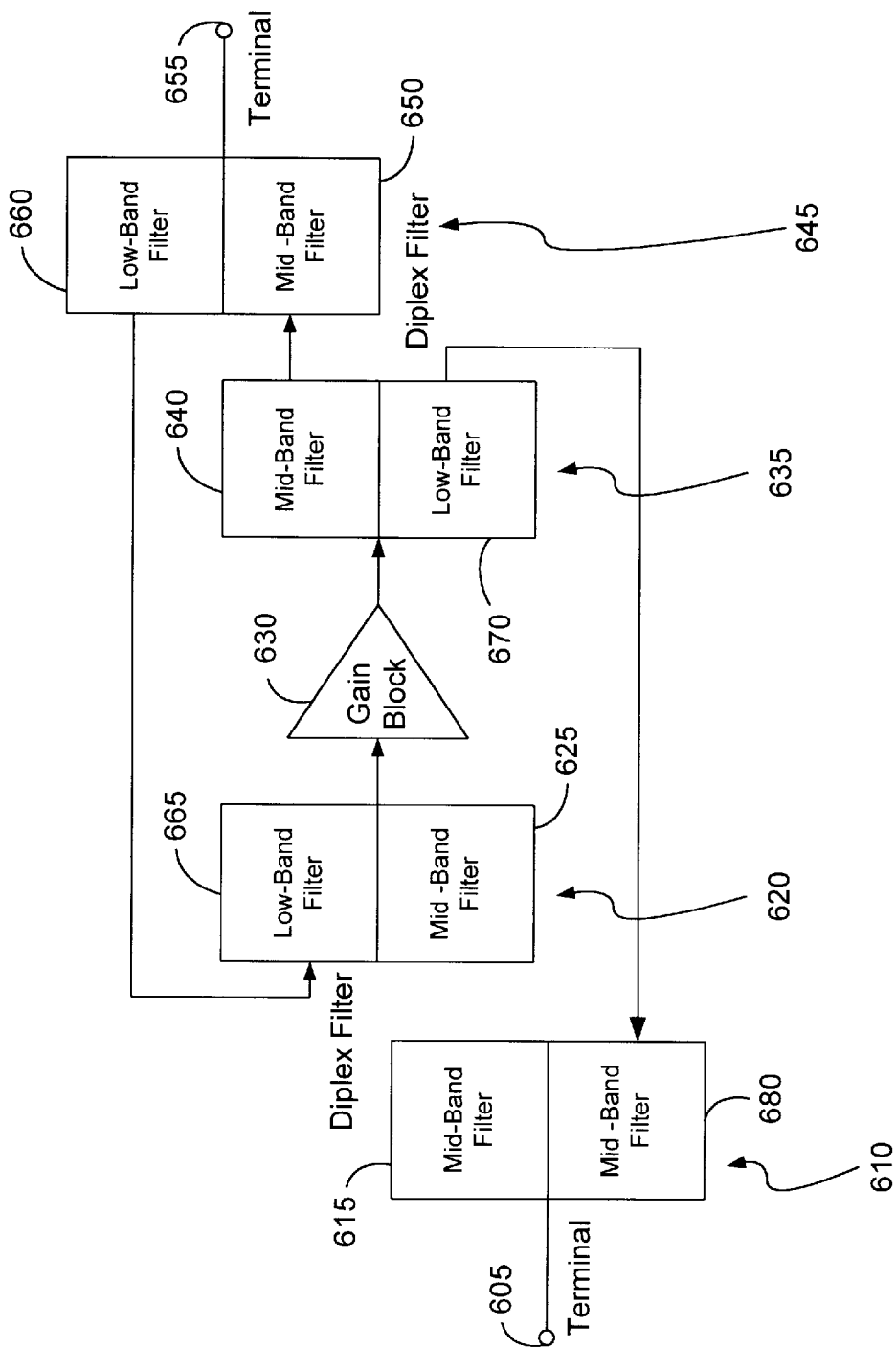
FIG. 6 is a block diagram of an amplifier with diplex filters routing forward and low-band reverse signals on a common path to a single gain block in accordance with the present invention.
Figure 6:
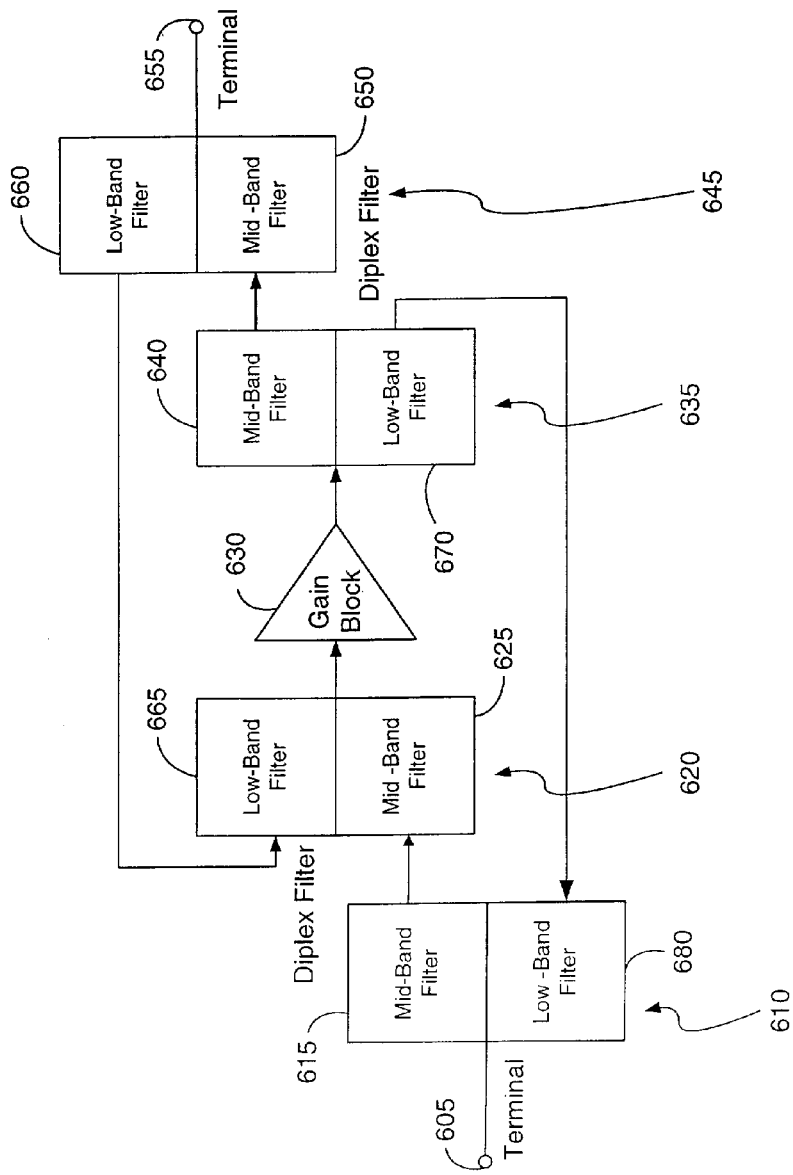

The amplification circuitry of FIG. 5 utilizes a high-band reverse bandwidth for overall increased reverse frequency range. Additionally, it will also be appreciated that the amplifier of the present invention can be utilized with the conventional bandwidth splits without implementing the high-band reverse bandwidth. FIG. 6 illustrates an amplifier for processing signals having the conventional forward and reverse bandwidth splits, i.e., 5 MHz to 40 MHz for the reverse bandwidth and 52 MHz to 870 MHz for the forward bandwidth. This amplifier 600 has an input/output terminal 605 for receiving a forward signal and for transmitting a reverse signal. A diplex filter 610 with a mid-band filter 615 isolates the forward signal from the reverse signal. Further isolation is performed in a second diplex filter 620. A mid-band filter 625 in the second diplex filter 620 routes the forward signal onto a common path to a single gain block 630, which amplifies the signal for further transmission. A diplex filter 635 with a mid-band filter 640 isolates the amplified forward signal from the reverse signal, and the forward signal is then further isolated in an output diplex filter 645 with a mid-band filter 650. The forward signal continues downstream through an input/output terminal 655 in the output diplex filter 645.

Although the filters for passing the forward signals are referred to as "mid-band" filters, it will be appreciated that, if no higher-band reverse path signals are processed, the filters for passing forward signals could instead be configured as high-pass filters for passing all signals having frequencies greater than those included in the reverse path spectrum.

Referring to FIG. 6 in the upstream direction, the input/output terminal 655 accepts the reverse signal and filters it from the forward signal through a low-band filter 660 in the diplex filter 645. The reverse signal is further isolated with a low-band filter 665 in the diplex filter 620 before being routed onto a common path with the forward signal and amplified by the common gain block 630. A low-band filter 670 isolates the reverse signal from the forward signal in the diplex filter 635 then the reverse signal is further isolated in the final diplex filter 610 with a low-band filter 680. The reverse signal then continues in the upstream path through the input/output terminal 605.

In summary, the present invention utilizes diplex filters that route a forward signal and a reverse signal onto a common path for amplification by a single gain block. As a result, this allows the communication systems the ability to implement a reverse signal in a high-band frequency in addition to the conventional reverse frequency spectrum, for an overall increase in reverse bandwidth without use of additional gain blocks. Additionally, the amplifier of the present invention can be implemented to provide a single gain block for amplifying signals in both the conventional forward frequency spectrum and conventional reverse frequency spectrum to reduce costs by decreasing the number of gain blocks even when additional reverse bandwidth is not processed.

What is claimed is:

1. An amplifier for amplifying signals, the amplifier comprising:

a first terminal for receiving forward signals in a first frequency band;

a second terminal for receiving reverse signals in a second frequency band; and a single gain block coupled between the first terminal and the second terminal for amplifying the forward signals and the reverse signals, wherein the forward signals, after amplification, are provided to the second terminal for transmission from the amplifier, and wherein the reverse signals, after amplification, are provided to the first terminal for transmission from the amplifier.

2. The amplifier of claim 1, further comprising:

forward path filters for isolating the forward signals, providing the forward signals to the single gain block, and routing the forward signals, after amplification, to the second terminal; and reverse path filters for isolating the reverse signals, providing the reverse signals to the single gain block, and routing the reverse signals, after amplification, to the first terminal.

3. The amplifier of claim 1, wherein the single gain block comprises:

one input for receiving the forward signals within the first frequency band and for receiving the reverse signals within the second frequency band;

one output for transmitting the forward signals within the first frequency band to the second terminal and for transmitting the reverse signals within the second frequency band to the first terminal; and a gain stage coupled between the one input and the one output for amplifying the forward signals within the first frequency band and the reverse signals within the second frequency band, wherein the gain stage provides amplification at all frequencies included within the first frequency band and the second frequency band.

4. The amplifier of claim 2, wherein the forward path filters and the reverse path filters are implemented using diplex filters.

5. The amplifier of claim 2, wherein the forward path filters and the reverse path filters further comprise:

a first diplex filter including a mid-band filter and a low-band filter, the first diplex filter further including a common port coupled to the first terminal, a mid-band port, and a low-band port;

a second diplex filter including a low-band filter and a mid-band filter, the second diplex filter further including a low-band port, a mid-band port coupled to the mid-band port of the first diplex filter, and a common port coupled to an input of the single gain block;

a third diplex filter including a mid-band filter and a low-band filter, the third diplex filter further including a common port coupled to an output of the single gain block, a low-band port coupled to the low-band port of the first diplex filter, and a mid-band port; and a fourth diplex filter including a low-band filter and a mid-band filter, the fourth diplex filter further including a mid-band port coupled to the mid-band port of the third diplex filter, a low-band port coupled to the low-band port of the second diplex filter, and a common port coupled to the second terminal.

6. An optical node for transmitting signals, the optical node comprising:

a laser receiver for converting optical signals to forward radio frequency (RF) signals and transmitting the forward RF signals downstream;

a laser transmitter for receiving reverse RF signals from upstream and converting the reverse RF signals to reverse optical signals; and an amplifier for amplifying the forward RF signals and the reverse RF signals, the amplifier comprising:

an input terminal for receiving forward RF signals within a first frequency band from the laser receiver;

an output terminal for transmitting reverse RF signals within a second frequency band to the laser transmitter and for transmitting reverse RF signals within a third frequency band to the laser transmitter;

an input/output terminal for transmitting forward RF signals within the first frequency band, and for receiving reverse RF signals within the second frequency band and reverse RF signals within the third frequency band;

a first gain block coupled between the input terminal and the input/output terminal for amplifying the forward RF signals within the first frequency band and the reverse RF signals within the third frequency band, wherein the forward RF signals, after amplification, are provided to the input/output terminal for transmission from the amplifier, and wherein the reverse RF signals, after amplification, are provided to the output terminal for transmission from the amplifier; and a second gain block coupled between the input/output terminal and the output terminal for amplifying the reverse RF signals within the second frequency band, wherein the reverse RF signals, after amplification, are provided to the output terminal for transmission from the amplifier.

7. The optical node of claim 6, wherein the first gain block comprises:

one input port for receiving the forward RF signals within the first frequency band and for receiving the reverse RF signals within the third frequency band;

one output port for transmitting the forward RF signals within the first frequency band to the input/output terminal and for transmitting the reverse RF signals within the third frequency band to the output terminal; and a gain stage coupled between the input terminal and the input/output terminal for amplifying the forward RF signals within the first frequency band and reverse RF signals within the third frequency band, wherein the gain stage provides amplification at all frequencies included within the first frequency band and the third frequency band.

8. The optical node of claim 6, wherein the amplifier further comprises:

forward path filters for isolating the forward RF signals, providing the forward RF signals to the first gain block, and routing the forward RF signals, after amplification, to the input/output terminal;

first reverse path filters for isolating the reverse RF signals within the third frequency band, providing the reverse RF signals within the third frequency band to the first gain block, and routing the reverse RF signals within the third frequency band, after amplification, to the output terminal; and second reverse path filters for isolating the reverse RF signals within the second frequency band, providing the reverse RF signals within the second frequency band to the second gain block, and routing the reverse RF signals within the second frequency band, after amplification, to the output terminal.

9. The optical node of claim 8, wherein the forward path filters, the first reverse path filters, and the third reverse path filters are implemented using diplex filters.

10. The optical node of claim 8, wherein the forward path filters, the first reverse path filters, and the third reverse path filters further comprise:

a first diplex filter including a high-band filter and a mid-band filter, the first diplex filter further including a mid-band port coupled to the input terminal, a high-band port, and a common port coupled to an input of the first gain block;

a second diplex filter including a mid-band filter and a high-band filter, the second diplex filter further including a common port coupled to an output of the first gain block, a high-band port coupled to the output terminal, and a mid-band port;

a third diplex filter including a high-band filter and a mid-band filter, the third diplex filter further including a mid-band port coupled to the mid-band port of the second diplex filter, a high-band port coupled to the high-band port of the first diplex filter, and a common port; and a fourth diplex filter including a low-band filter and a mid/high-band filter, the fourth diplex filter further including a mid/high-band port coupled to the common port of the third diplex filter, a low-band port coupled to an input of the second gain block, and a common port coupled to the input/output terminal.

11. An amplifier for amplifying signals, the amplifier comprising:

a first terminal for receiving forward signals in a first frequency band;

a second terminal for receiving reverse signals in a second frequency band and a third frequency band;

a first gain block coupled between the first terminal and the second terminal for amplifying the forward signals within the first frequency band and the reverse signals within the third frequency band, wherein the forward signals within the first frequency band, after amplification, are provided to the second terminal for transmission from the amplifier, and wherein the reverse signals within the third frequency band, after amplification, are provided to the first terminal for transmission from the amplifier; and a second gain block coupled between the second terminal and the first terminal for amplifying the reverse signals within the second frequency band, wherein the reverse signals within the second frequency band, after amplification, are provided to the first terminal for transmission from the amplifier.

12. The amplifier of claim 11, wherein the first gain block comprises:

one input port for receiving forward signals within the first frequency band and for receiving reverse signals within the third frequency band;

one output port for transmitting forward signals within the first frequency band to the second terminal and for transmitting reverse signals within the third frequency band to the first terminal; and a gain stage for amplifying the forward signals within the first frequency band and the reverse signals within the third frequency band, wherein the gain stage provides amplification at all frequencies included within the first frequency band and the second frequency band.

13. The amplifier of claim 11, further comprising:

forward path filters for isolating the forward signals within the first frequency band, providing the forward signals within the first frequency band to the first gain block, and routing the forward signals within the first frequency band, after amplification, to the second terminal;

first reverse path filters for isolating the reverse signals within the third frequency band, providing the reverse signals within the third frequency band to the first gain block, and routing the reverse signals within the third frequency band, after amplification, to the first terminal; and second reverse path filters for isolating the reverse signals within the second frequency band, providing the reverse signals within the second frequency band to the second gain block, and routing the reverse signals within the second frequency band, after amplification, to the first terminal.

14. The amplifier of claim 13, wherein the forward path filters, the first reverse path filters, and the second reverse path filters are implemented using diplex filters.

15. The amplifier of claim 13, wherein the forward path filters, the first reverse path filters, and the second reverse path filters further comprise:

a first diplex filter including a low-band filter and a mid/high-band filter, the first diplex filter further including a common port coupled to the first terminal, a mid/high-band port, and a low-band port coupled to an output of the second gain block;

a second diplex filter including a mid-band filter and a high-band filter, the second diplex filter further including a common port coupled to the mid/high-band port of the first diplex filter, a high-band port, and a mid-band port;

a third diplex filter including a high-band filter and a mid-band filter, the third diplex filter further including a high-band port, a mid-band port coupled to the mid-band port of the second diplex filter, and a common port coupled to an input of the first gain block;

a fourth diplex filter including a mid-band filter and a high-band filter, the fourth diplex filter further including a common port coupled to an output of the first gain block, a mid-band port, and a high-band port coupled to the high-band port of the second diplex filter;

a fifth diplex filter including a high-band filter and a mid-band filter, the fifth diplex filter further including a high-band port coupled to the high-band port of the third diplex filter, a mid-band port coupled to the mid-band port of the fourth diplex filter, and a common port;

a sixth diplex filter including a low-band filter and a mid/high-band filter, the sixth diplex filter further including a low-band port coupled to an input of the second gain block, a mid/high-band filter coupled the common port of the fifth diplex filter, and a common port coupled to the second terminal.

* * * * *

UNITED STATES PATENT AND TRADEMARK OFFICE
CERTIFICATE OF CORRECTION

PATENT NO. : 6,348,837 B1
DATED : February 19, 2002
INVENTOR(S) : Pieter Ibelings It is certified that error appears in the above-identified patent and that said Letters Patent is hereby corrected as shown below:

Title page,
The title page showing the illustrative figure should be deleted to be replaced with the attached title page.

Drawings,
Drawing sheet, consisting of Fig. 6, should be deleted to be replaced with the drawing sheet, consisting of Fig. 6, as shown on the attached page.

Signed and Sealed this

First Day of October, 2002

Attest:

JAMES E. ROGAN
Attesting Officer
Director of the United States Patent and Trademark Office

(12) United States Patent
Ibelings

(10) Patent No.: US 6,348,837 B1
(45) Date of Patent: Feb. 19, 2002

(54) BI-DIRECTIONAL AMPLIFIER HAVING A SINGLE GAIN BLOCK FOR AMPLIFYING BOTH FORWARD AND REVERSE SIGNALS

(75) Inventor: Pieter Ibelings, Norcross, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/634,119

(22) Filed: Aug. 8, 2000

(51) Int. Cl.[7] .............................. H03F 3/68; H01P 5/12
(52) U.S. Cl. ........................ 330/126; 330/59; 333/109
(58) Field of Search .................. 330/59, 126; 333/109; 348/693, 707

(56) References Cited

U.S. PATENT DOCUMENTS

| | | | |
|---|---|---|---|
| 4,812,779 A | * 3/1989 | Wagner | 330/149 |
| 5,774,458 A | * 6/1998 | Williamson | 370/276 |
| 5,870,395 A | * 2/1999 | Baran | 370/395 |
| 5,881,362 A | * 3/1999 | Eldering et al. | 348/7 |
| 6,023,612 A | * 2/2000 | Harris et al. | 455/127 |
| 6,091,301 A | * 7/2000 | Vogt | 330/278 |
| 6,215,358 B1 | * 4/2001 | Hon et al. | 330/289 |

* cited by examiner

Primary Examiner—Robert Pascal
Assistant Examiner—Khanh Van Nguyen
(74) Attorney, Agent, or Firm—Hubert J. Barnhardt, III; Kenneth M. Massaroni; Shelley L. Couturier

(57) ABSTRACT

An amplifier (600) includes a first terminal (605) for receiving forward signals in a first frequency band and a second terminal (655) for receiving reverse signals in a second frequency band. A single gain block (630) is coupled between the first terminal (605) and the second terminal (655) for amplifying the forward signals and the reverse signals. The forward signals, after amplification, are provided to the second terminal (655) for transmission from the amplifier (600), and the reverse signals, after amplification, are provided to the first terminal (605) for transmission from the amplifier (600). In this manner, both forward and reverse signals, which are transmitted in separate frequency bands, can be amplified by a single gain block (630).

15 Claims, 6 Drawing Sheets

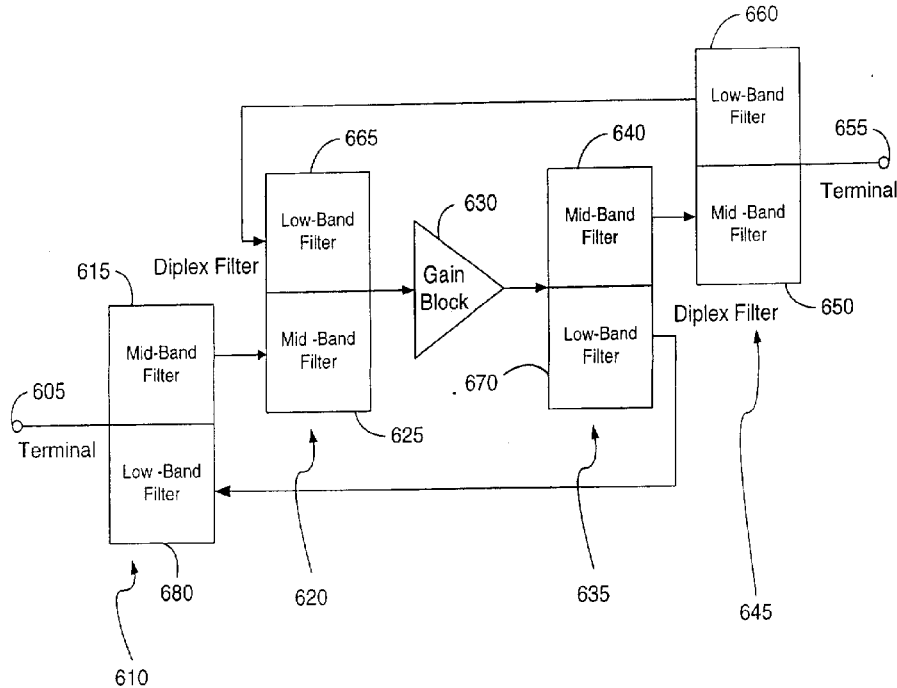

UNITED STATES PATENT AND TRADEMARK OFFICE
CERTIFICATE OF CORRECTION

PATENT NO.   : 6,348,837 B1
DATED        : February 19, 2002
INVENTOR(S)  : Ibelings It is certified that error appears in the above-identified patent and that said Letters Patent is hereby corrected as shown below:

Column 5,
Line 13, delete "band" between "high-band" and "filters".

Signed and Sealed this

Fifteenth Day of April, 2003

JAMES E. ROGAN
*Director of the United States Patent and Trademark Office*